United States Patent [19]
Lindsay et al.

[11] Patent Number: 5,300,931
[45] Date of Patent: Apr. 5, 1994

[54] MEMORY BASED VECTOR QUANTIZATION

[75] Inventors: Robert A. Lindsay, Bountiful; Patrick S. Grant, Orem; Val D. Vaughn, N. Salt Lake, all of Utah

[73] Assignee: UNISYS Corporation, Blue Bell, Pa.

[21] Appl. No.: 93,331

[22] Filed: Sep. 4, 1987

[51] Int. Cl.⁵ .................................................. H03M 7/30
[52] U.S. Cl. ........................................ 341/106; 341/87
[58] Field of Search ............... 364/200; 341/106, 87; 358/156, 263

[56] References Cited

U.S. PATENT DOCUMENTS

| | | | |
|---|---|---|---|
| 4,490,786 | 12/1984 | Nakatani | 364/200 |
| 4,606,069 | 8/1986 | Johnsen | 358/263 |
| 4,626,829 | 12/1986 | Hauck | 341/87 |
| 4,710,812 | 12/1987 | Murakami et al. | 358/136 |
| 4,727,354 | 2/1988 | Lindsay | 341/106 |
| 4,971,407 | 11/1990 | Hoffman | 341/87 |
| 4,988,998 | 1/1991 | O'Brien | 341/87 |

OTHER PUBLICATIONS

"Vector Quantization" by Robert M. Gray; IEEE Acoustical Speech and Signal Processing (ASSP) Apr. 1984@ pp. 4-29.

*Primary Examiner*—Salvatore Cangialosi
*Attorney, Agent, or Firm*—John B. Sowell; Mark T. Starr

[57] ABSTRACT

Apparatus is provided for performing two stages of high-speed compression of vector data inputs. Two input channels of vector data are compressed and encoded through a vector quantizer encoder to provide a first stage of data compression. The output of the first encoder is further decoded then compressed and encoded in a novel high-speed computing mapping means which may be implemented in the form of a look-up table. Vector quantized encoded output is double the previous data compression of a single stage. The second stage of data compression causes very little degradation of the data from the first stage of data compression.

17 Claims, 4 Drawing Sheets

MEMORY BASED VECTOR QUANTIZATION

BACKGROUND OF THE INVENTION

1. Field of the Invention

The present invention relates to extended or further compression of vector quantized encoded and compressed data. More specifically, the present invention relates to further compression by extension of the dimensionality of the vector space by a process of concatenation.

2. Description of the Prior Art

Vector quantization is a known technique or method which has been employed to achieve data compression. Design algorithms have been developed for a variety of vector quantizers and are presented in a scholarly paper entitled "Vector Quantization" by Robert M. Gray in the IEEE Acoustical Speech and Signal Processing (ASSP) Magazine published April 1984 @ pages 4–29 which includes a bibliography of seventy-seven (77) references. It is possible to approach a data compression system problem which involves speech waveforms and image data from the amount of distortion or degradation that will be permitted in the system. Having once decided on the permissible degradation or distortion, the amount of compression or the ratio of data compression may be calculated for the system being designed. Some data compression systems produce more distortion than others and different systems classified as vector quantization encoding systems will produce different amounts of distortion.

Heretofore, vectors representative of a matrix of 2×2 pixel blocks of 8-bits have been vector quantized and encoded to provide data compression of up to four to one with very good image quality produced at the decoder. Also, a single vector representative of a matrix of two 2×2 pixel blocks of 8-bits each could be vector quantized and encoded to provide the equivalent data compression of up to eight to one with very good image quality produced at the decoder. As will be explained hereinafter, the vector quantization system necessary to achieve this data compression of 8-bit pixels of information into an output of eight encoded bits to achieve an eight to one data compression ratio through the encoder requires an encoder with $2^{64}$ possible inputs with $2^8$ outputs. The hardware required to achieve such straight vector quantization is so large and massive so as not to be technically feasible employing the present state of the art technology.

It would be extremely desirable to provide in a single hardware system, a vector quantization and encoding system which would accomplish the aforementioned data compression and would be extremely fast and simple so that it could be packaged into a lightweight system which could be employed for airborne and satellite applications.

SUMMARY OF THE INVENTION

It is a principal object of the present invention to provide a system for further compressing vector quantized vectors.

It is another principal object of the present invention to provide a high-speed data compression system operable at speeds up to two gigahertz.

It is another principal object of the present invention to provide a data compression system for further compressing compressed data with high-speed and lightweight hardware.

It is another principal object of the present invention to provide a novel data compression system for combining vector representations of a plurality of scalar data inputs.

It is another principal object of the present invention to provide a novel data compression system for increasing compression ratios by extending vector dimensionality.

It is another object of the present invention to provide a novel data compression system for combining vector quantized encoded vectors and further compressing said vectors in a high-speed vector quantizing encoder.

It is a general object of the present invention to provide a novel high-speed look-up table having stored therein pre-computed compressed indices of extended vector space.

It is another general object of the present invention to provide a novel high-speed concatenation look-up table in the form of a vector quantizing decoder.

It is yet another object of the present invention to provide a system for performing two to one compression of two 8-bit vector inputs in commercially available 64K by 8-bit ROMs, RAMs and/or EEPROMS with very little degradation of the original scalar data.

According to these and other objects of the present invention, there is provided two input channels of vector data which are compressed and encoded through a vector quantizing encoder to provide a first stage of data compression. The output of the vector quantizing encoder is further compressed and encoded in a novel high-speed look-up table to double the previous data compression ratio in the second stage of further data compression with very little degradation of the data in the second stage of data compression.

DESCRIPTION OF THE PREFERRED EMBODIMENTS

Figure 1:
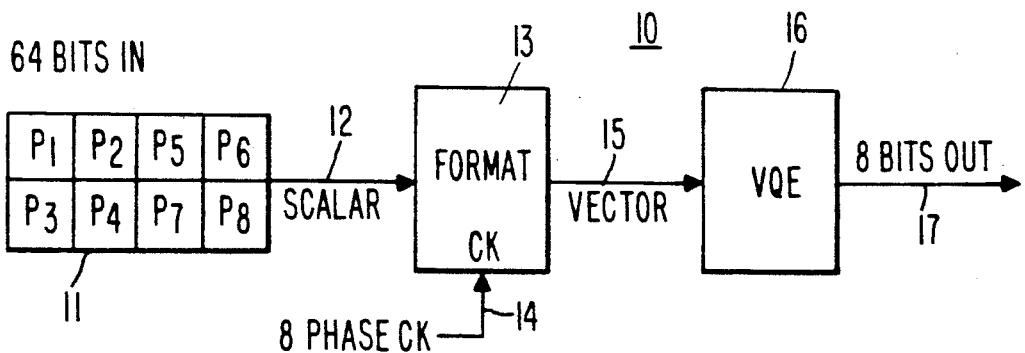
FIG. 1 is a schematic block diagram of a vector quantizing encoder of the prior art type required to encode a plurality of groups of extended sets of scalar data.

Refer now to FIG. 1 showing a schematic block diagram which illustrates the insurmountable problem presented by prior art technology. For purposes of illustration, the system 10 is shown having a block 11 containing scalar data shown here for purposes of illustration as pixels P1 to P8, each having 8-bits of information. The pixel group P1 to P4 is referred to as a 2×2 group and the group P1 to P8 is referred to as an extended group. It is desirable to compress the data represented by the block 11 into a vector of 8-bits so as to achieve an eight to one compression ratio of the data in block 11. The scalar data in block 11 is presented on line 12 to formatter 13 and assimilated by an 8-phase clock on line 14 to form an eight dimensional vector on output line 15. The output on line 15 comprises a vector having 64-bits presented as an input to the vector quantizing encoder 16 so as to encode and compress the eight dimensional vector and provide an 8-bit compressed index on output line 17. The 64-bit eight dimensional vector on input line 15 to VQE 16 presents $2^{64}$ possible inputs for producing the 8-bit output on line 17. The only way it is technically feasible to treat the $2^{64}$ possible inputs is with a high-speed computer or computing engine to perform the VQE function at block 16. Even then, the high-speed computing engine requires several seconds to perform the quantization function. Even then, the hardware capable of performing the operation in a matter of seconds is deemed to be too heavy for satellite and most airborne applications.

Figure 2:
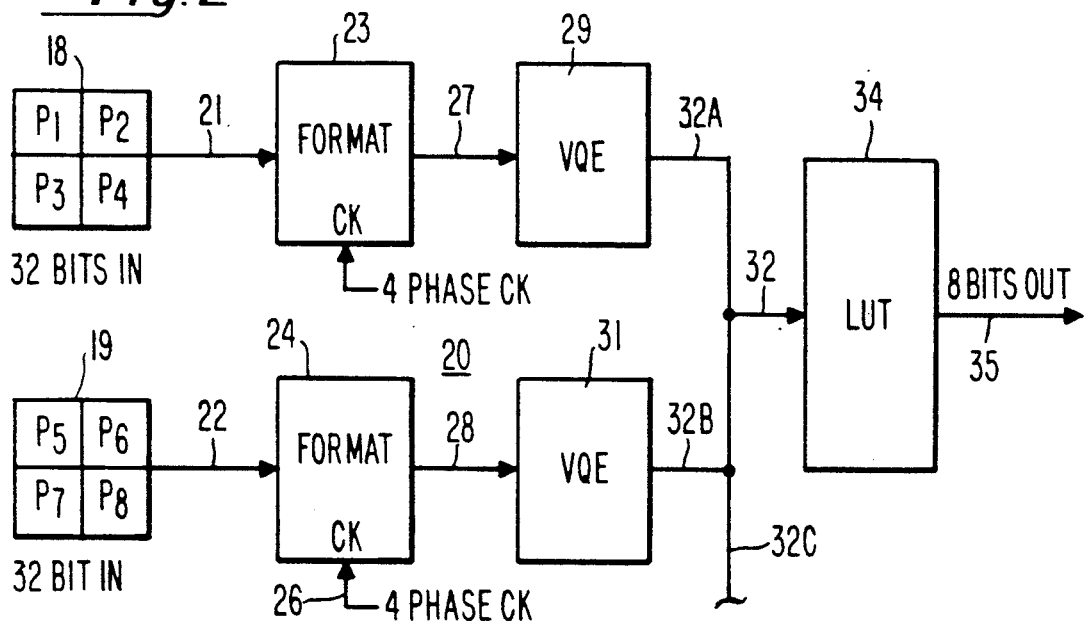
FIG. 2 is a simplified schematic block diagram showing the present invention vector quantizing encoder for encoding representative sets of scalar data and for combining the encoded outputs to provide further quantized encoding of plural groups of scalar data and to increase the compression ratio by extending vector dimensions.

Refer now to FIG. 2 showing a simplified schematic block diagram of the present invention data compression system 20 which is capable of being placed on a printed wiring board of approximately 30 square inches for achieving 200 megahertz cyclical operations, and on printed wiring boards of approximately 100 square inches for a 2 gigahertz version. The novel system of FIG. 2 shows blocks 18 and 19 having 2×2 pixel groups P1 to P4 and P5 to P8 respectively. The four pixel dimensional scalar information of 8-bits each is presented on lines 21 and 22 to formatters 23 and 24 and is synchronized by 4-phase clocks 25 and 26 to provide four dimensional vector outputs on lines 27 and 28. The 32-bit four dimensional vector input on lines 27 and 28 to VQEs 29 and 31 produce 8-bit compressed indices on output lines 32A and 32B which are hard wired ORed to provide a 16-bit compressed indices address on line 32 as an input to look-up table 34 which produces an 8-bit compressed index to the extended vector dimension. This is to say that the 8-bit indices on line 35 is a compressed indices or replica of the 64-bit scalar information presented on input lines 21 and 22. The two input vectors on lines 27 and 28 were compressed by a ratio of four to one in VQEs 29 and 31 and further compressed by a ratio of two to one in novel look-up table 34 as will be explained in detail hereinafter.

Figure 3:
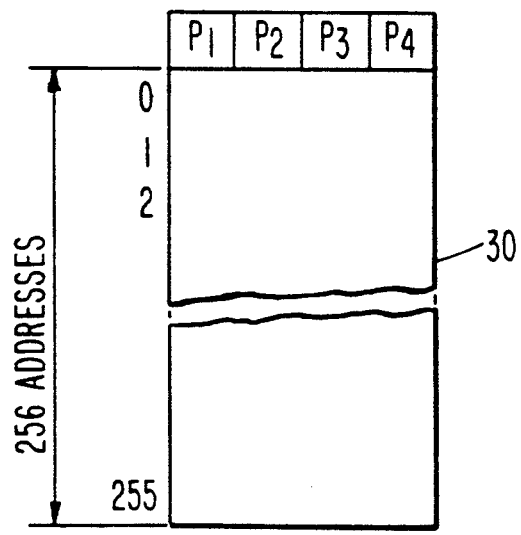
FIG. 3 is a table showing the representative sets of vectors used by the vector quantizing encoder (VQE) of FIG. 2.

Refer now to FIG. 3 showing a table 30 of the representative set of vectors employed in the VQEs 29 and 31. The table of FIG. 3 is basically showing that the four dimensional vector inputs on lines 27 and 28 to the VQEs 29 and 31 may be represented by an array of scalars which is four columns wide having a length of the representative set of 256 possible entries or addresses which will produce unique 8-bit outputs on line 32. It will be understood that a table like the table in FIG. 3 is incorporated into each of the VQEs 29 and 31 to produce unique outputs at their output lines 32A and 32B. Further, the dual channel input configuration shown in FIG. 2 may be further expanded in parallel fashion with other dual channel input pairs and connected to the same look-up table 34 via bus 32C in a time-sharing fashion to increase the speed of operation of the compression system 20 by parallel operation of the VQEs employing the single output look-up table 34. The VQEs require multiple computing engine operations whereas the look-up table is a single cycle clocked operation and is capable of faster speeds. It has been established that as many as twenty dual channel input pairs may be incorporated into parallel VQE operations for input into a single look-up table 34.

Figure 4:
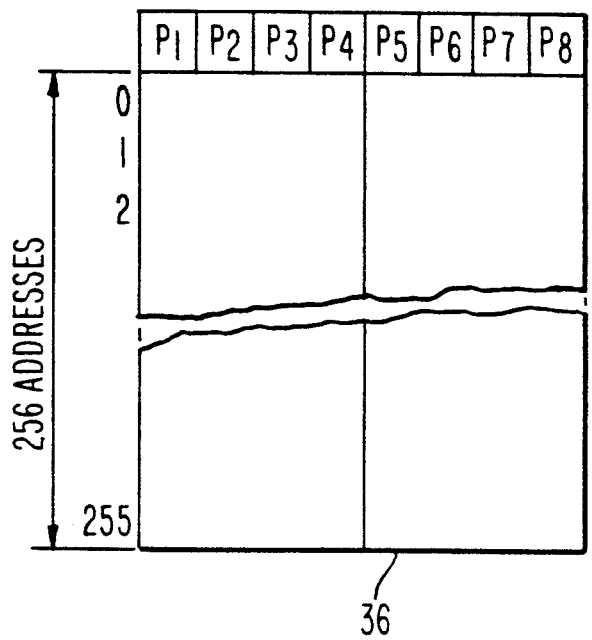
FIG. 4 is a table showing the representative vectors of the concatenated vector space which occurs in the look-up table of FIG. 2.

Refer now to FIG. 4 comprising a table 36 showing the representative vectors of the concatenated vector space which occurs in a preferred embodiment look-up table 34. The FIG. 4 table 36 represents that there are 256 possible input addresses or pointers which will produce unique 8-bit outputs on line 35 of FIG. 2. There are algorithms referred to in the aforementioned Gray paper (specifically the LBG algorithm) which describe how the information for the representative sets in the table of FIG. 4 may be computed. The computation of the representative sets of information stored in the table of FIG. 4 does not comprise a part of the present invention and is not described in detail herein.

Figure 5:
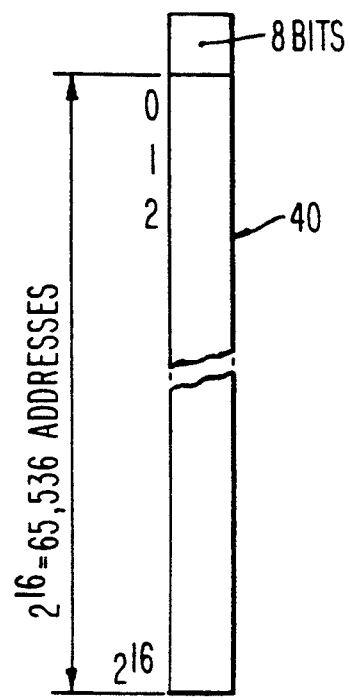
FIG. 5 is a table showing a pre-computed mapping of compressed indices of the VQEs of FIG. 2 into compressed indices of extended vector space.

Refer now to FIG. 5 showing a precomputed mapping of the compressed indices of extended vector space shown as an output on line 35. The table 40 of FIG. 5 illustrates that there are 65,536 possible input addresses to the look-up table 34 which will produce 65,536 unique compressed compressed 8-bit outputs on line 35. Stated differently, the memory is illustrated as having a column 8-bits wide which may be addressed by 65,536 different addresses to produce an 8-bit output. The table is a computing mapping of compressed indices from the VQEs 29 and 31 into a compressed indices indicative of the representatives in the table of FIG. 4. As will be explained hereinafter, the novel look-up table of FIG. 5 may be substituted for a more complex extension method.

Look-up table 40 is preferably a PROM or EEPROM defined by creating a correspondence (mapping) table between a 2×2 vector codebook and a 2×4 vector codebook where the 2×4 vector on line 32 is composed of 2×2 vectors side by side. Both codebooks are created as normal vector quantized codebooks, then the best fit, usually the least means square error (LMSE) fit, to the sets of 2×4 vectors in the 2×4 codebook are pre-computed (mapped) for every possible pair of vectors of the 2×2 codebook. The indices of the two 2×2 vectors are then matched to the index of the 2×4 vector which has the best fit. The indices of the 2×2 vectors then become the address of the index of the 2×4 vector stored in look-up table 40. Because the vector data on line 32 is already well matched to the actual scalar data on lines 21, 22, only minor degradation will occur compared to normal 8 to 1 compression of a 2×4 pixel group in one stage.

Figure 6:
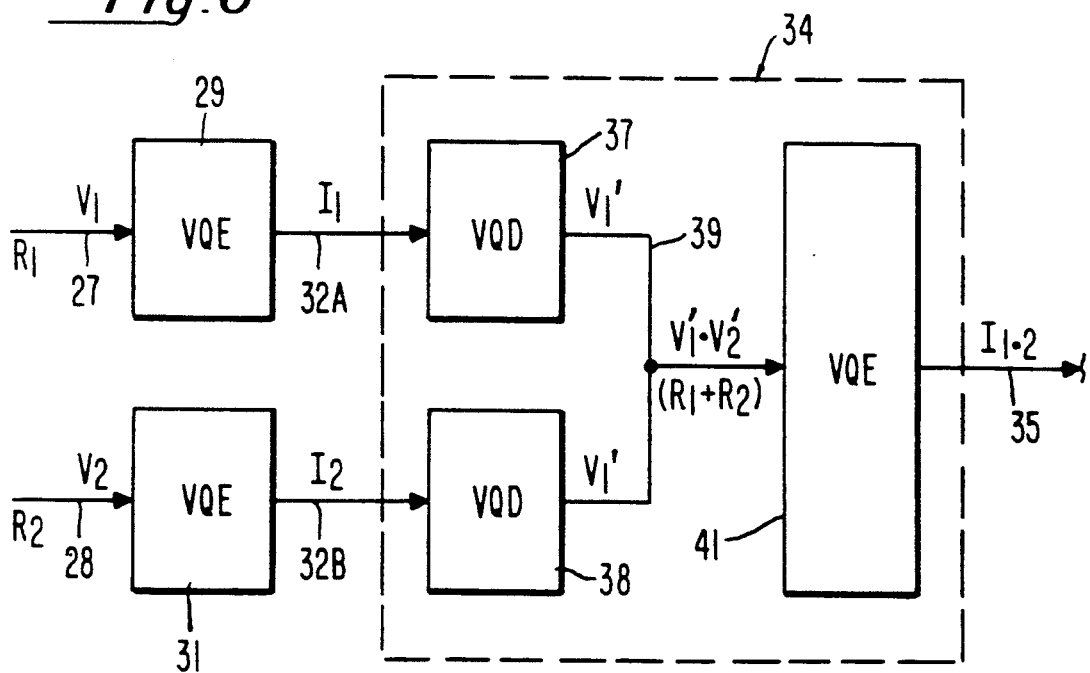
FIG. 6 is a schematic block diagram showing the novel procedure employed to generate the pre-computed mapping of compressed indices of compressed indices recorded in the look-up table of FIG. 5.

Refer now to FIG. 6 showing in schematic block diagram form the structure which may be employed to generate indices for the novel look-up table 40. Vectors V1 and V2 on input lines 27 and 28 to the VQEs 29, 31 are shown comprising vector inputs of dimension R1 and R2. For purposes of the general explanation, the vectors V1 and V2 have dimensionality R1 and R2 respectively. The output from the VQEs 29, 32 is shown as indices I1 and I2 which are applied to the look-up table 34 which here comprises the vector quantizing decoders 37 and 38. The output from decoders 37 and 38 is shown as a quantized vector V1', V2', on line 39 which is hard wired ORed to produce an extended vector V1'·V2' where V1'·V2' designates the concatenation of vectors V1' and V2' to form a vector of dimensionality R1 plus R2. The concatentation of vectors V1' and V2' is defined as a Cartesian product of V1' and V2'. The concatenated vector input on line 39 is applied to a vector quantizing encoder 41 which employs the representative set of FIG. 4 explained hereinbefore. It will be understood that the encoder 41 may be a computing engine of the high-speed microprocessor type or preferably a plurality of gate arrays employed to accomplish the same function. The first compression occurs at VQEs 29, 31 which may be combined, and the second compression occurs at VQE 41 in look-up table 34 to produce the compressed compressed index of the extended vector space on line 35 as an output. It will be noted that the block 34 of FIG. 6 computes the mapping of the input indices I1, I2, into the compressed index of the extended vector space $I_{1\cdot 2}$ on line 35 and the same result may be achieved at high-speed by pre-computing mapping using the look-up table of FIG. 5 which contains the same pre-computed information.

Figure 7:
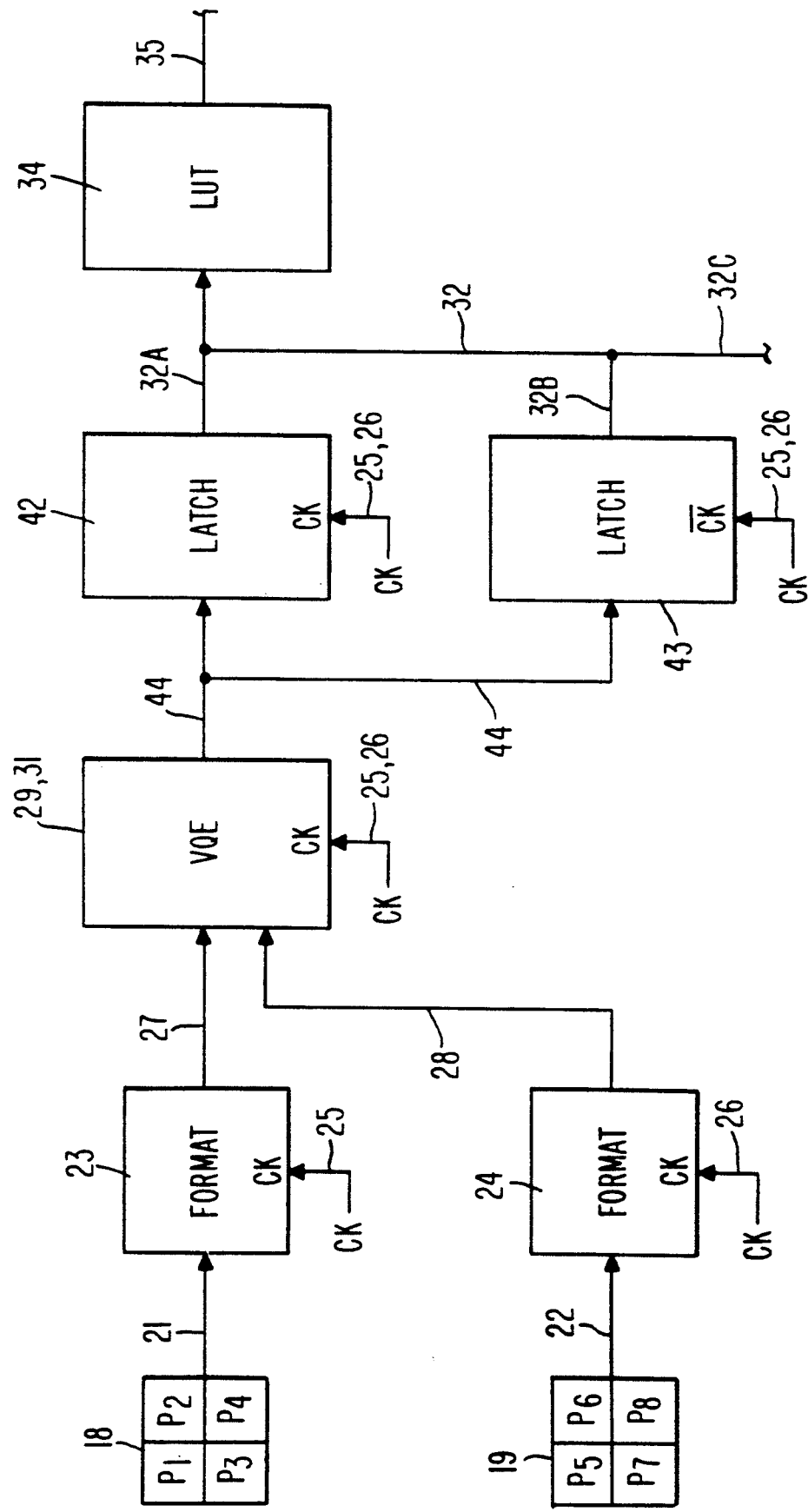
FIG. 7 is a schematic block diagram of a modified time-shared embodiment of the VQEs of FIG. 2.

Refer now to FIG. 7 showing in schematic block diagram form a modified time-shared embodiment of the system 20 of FIG. 2. To simplify the explanation of FIG. 7, the elements of FIG. 7 which are substantially the same or identical to the elements of FIG. 2 are numbered the same and do not require further explanation here. FIG. 7 shows how to time multiplex a high-speed gate array employed as a VQE rather than to employ plural VQES. In order to time multiplex the outputs from the VQEs 29, 31, it is necessary to employ an 8-phase clock signal at line 25, 26 as an input to the VQE and employ slower phases of clock signals 25, 26 as the input to the latches 42 and 43. The input line 44 is a time multiplex version of the output bus 32 and the purpose of the latches 42 and 43 is to provide the time-shared interface as an input to the look-up table 34 as explained hereinbefore which produces the compressed index of the extended vector space on line 35. In the preferred embodiment version of the present invention, extremely high-speed gallium arsenide gate arrays are employed as VQE encoding engines and the look-up table 34 is preferably high-speed EEPROMS which are commercially available in larger sizes than RAMs or ROMS even though they are operable at slightly slower speeds.

Figure 8:
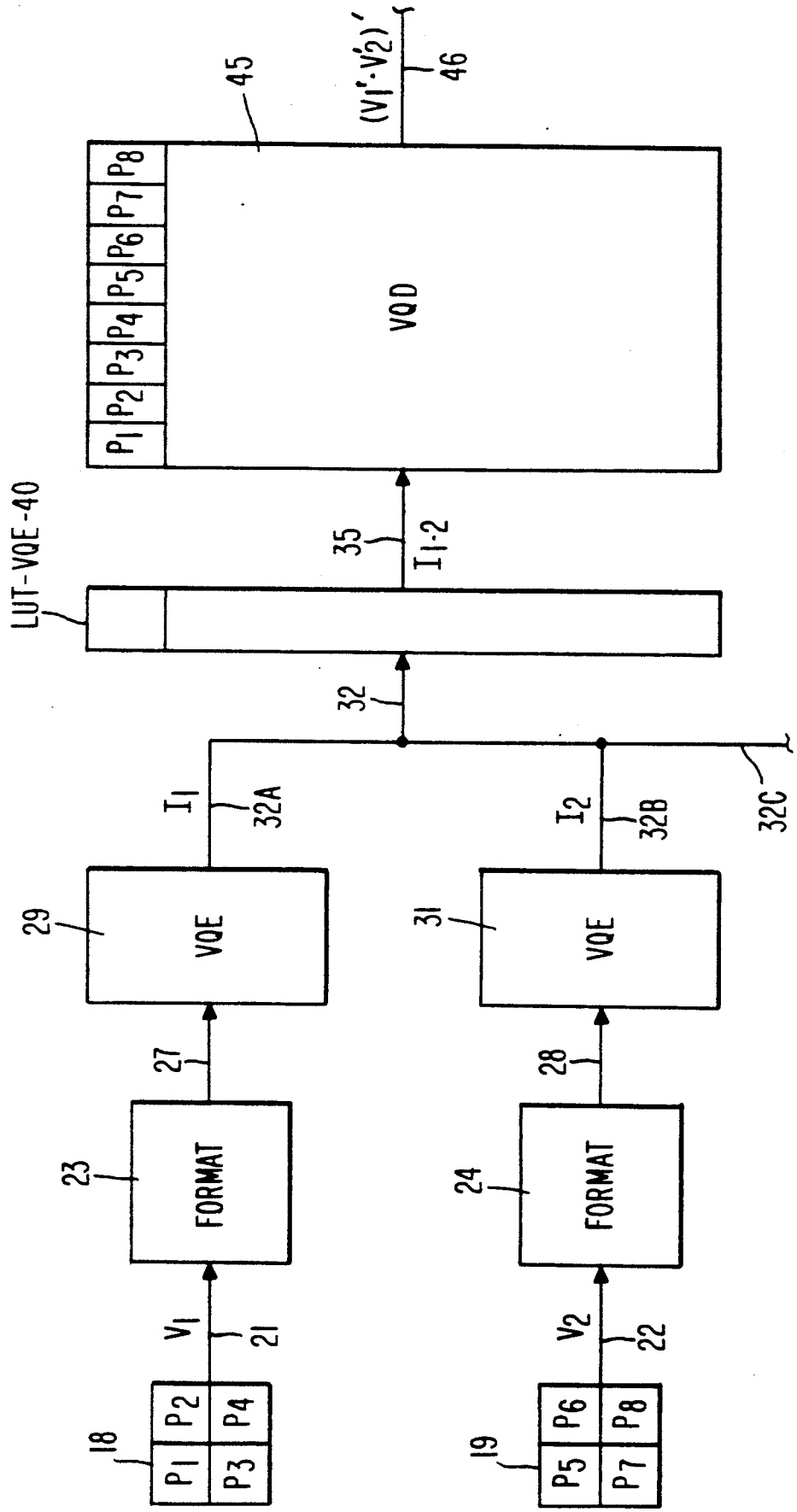
FIG. 8 is a schematic block diagram summarizing the functions of the procedures for compressing compressed data and for decoding the compressed compressed data.

Refer now to FIG. 8 which is a schematic block diagram summarizing the features and functions of the embodiments described hereinbefore with regards to FIGS. 2 and 7 and employ the same numbers on the same elements where applicable. Thus, the description and operation of these same elements will not again be described in detail. Scalar components presented on input lines 21 and 22 are applied as vector components on lines 27 and 28 to the high-speed VQEs 29 and 31, preferably constructed from gate arrays to reduce weight and size and increase speed of operation. The vector indices I1 and I2 on the output lines from VQEs 29 and 31 are hard wired ORed and presented to the preferred embodiment look-up table 40 described hereinbefore with regards to FIG. 5. The compressed index $I_{1\cdot 2}$ of the extended vector space on line 35 is applied as an input to the vector quantizing decoder 45. The vector quantizing decoder 45 basically employs 8-bits as an input address to produce 8 pixels of eight bits each as an output or and eight to one expansion employing the representative sets of the extended vector space shown and described with respect to FIG. 4 hereinbefore. Thus, the decoder 45 in the preferred embodiment high-speed data compressor may be basically a look-up table which is pre-computed and mapped identical to the FIG. 4 embodiment. The replica of the replica on output 46 may be processed to recover the quantized pixel bits.

Having explained a generalized preferred embodiment and a time-shared modification thereof, it will now be understood that the FIG. 8 embodiment may be constructed employing very high-speed integrated circuits (VHSIC) which are only limited by the operating speed of the solid state devices and not by the cyclical operating speed of a serial processor.

Further, it will be noted from the FIG. 8 block diagram that the vectors applied to the first stage VQEs 29, 31 a first stage compression to produce indices I1 and I2 and that the novel look-up table 40 forms a second stage of compression to produce the unique indices $I_{1\cdot 2}$ which is applied as an input to a single stage VQD decoder 45 to produce the representative vector of the extended vector space shown as $(V'_1 \cdot V'_2)$ which represents that there has been a decompression of previously twice compressed vector data.

In the present state of the art, it is possible to construct look-up tables of the type described hereinbefore with respect to FIG. 5 having as many as $2^{20}$ inputs by 16 outputs without penalizing the aforementioned data compression system or slowing down the enhanced speed. However, if a larger number of inputs than $2^{20}$ is desired, which would constitute an unmanageable expansion of space and hardware, the look-up table of FIG. 6 may be substituted for the look-up table of FIG. 5 to produce the desired extendability feature of the present invention.

The method for creating a preprocessed extended vector dimension look-up table was discussed hereinbefore with reference to table 40 and FIGS. 5 and 6. Individual representative sets (codebooks) are created for each input vector space $V_1 \cdot V_2$. The two vector spaces are concatenated into a larger vector space by combining the vector space (components) wherein the dimensionality of the new larger vector space is the sum of the dimensions of the initial input vector spaces. This permits the creation of a representative set (or codebook) for the combined vector space (components) similar to FIG. 5. The FIG. 5 codebook is a computed mapping of the concatenation of all possible combinations of the representative vectors from the initial individual representative output codes on bus 32 shown in FIGS. 2 and 6.

What is claimed is:

1. Apparatus for high-speed compression of vector data inputs comprising:
   means for storing groups of scalar data,
   means for formatting said groups of scalar data into a plurality of vector dimensional data inputs coupled to said means for storing groups of scalar data,
   first encoder means for vector quantizing said plurality of vector data inputs to provide a plurality of compressed encoded index data outputs, said compressed encoded index data outputs providing a unique index pointer output, and means for computing mapping of data on said compressed encoded index data outputs to provide a compressed compressed output coupled to said unique index pointer output.

2. Apparatus as set for in claim 1 wherein said means for computing mapping comprises a look-up table.

3. Apparatus as set forth in claim 2 wherein said look-up table comprises a memory having up to $2^{20}$ unique possible address inputs for producing up to $2^4$ outputs.

4. Apparatus as set forth in claim 2 wherein said look-up table comprises a precomputed mapping of index information representations of vector quantized values.

5. Apparatus as set forth in claim 1 wherein said means for computing mapping comprises vector quantizing decoding means coupled to said first encoder means, and
second encoder means for quantizing the output of said decoder means.

6. Apparatus as set forth in claim 5 wherein said decoder means comprises a memory look-up table.

7. Apparatus as set forth in claim 6 wherein said second encoder means comprises VHSIC gate arrays.

8. Apparatus as set forth in claim 1 wherein said means for storing groups of scalar data comprises memory means for storing digital data.

9. Apparatus as set forth in claim 1 wherein said groups of scalar data each defines a $2 \times 2$ matrix of individual image pixel data.

10. Apparatus as set forth in claim 1 wherein said first encoder means comprises a pair of vector quantizing encoders.

11. Apparatus as set forth in claim 1 where said first encoder means comprises a plurality of pairs of vector quantizing encoders.

12. Apparatus as set forth in claim 1 wherein the plurality of outputs of said first encoder means are combined to form a unique index pointer.

13. Apparatus as set forth in claim 12 wherein said means for computing mapping comprises a precomputed map having as many address locations as there are unique addresses and each memory address location is provided with as many bits stored therein as there are bits in said pre-computed extended representative set output from said pre-computed map.

14. Apparatus as set forth in claim 1 which further includes a vector quantizer decoder coupled to the output of said means for computing mapping.

15. Apparatus as set forth in claim 14 wherein said vector quantizer decoder comprises a look-up table.

16. Apparatus as set forth in claim 1 wherein said means for computing mapping comprises a look-up table having a compressed compressed encoded index data output which is adapted to be coupled to a vector quantizing decoder having an extended vector space stored in memory locations therein.

17. A method for high-speed compression of vector data comprising the steps of:
storing groups of scalar data,
formatting said groups of scalar data into a plurality of vector dimensional data inputs,
vector quantize-encoding said plurality of vector data inputs to provide a compressed encoded index data output indicative of a unique index address, and
addressing a pre-computed look-up table with said unique index address to provide a concatenated vector space representative vector index of said compressed encoded index thereby further compressing said compressed encoded index data.

* * * * *